(12) United States Patent
Omori et al.

(10) Patent No.: US 7,892,651 B2
(45) Date of Patent: *Feb. 22, 2011

(54) RESIN COMPOSITE METAL FOIL, LAMINATE AND PROCESS FOR THE PRODUCTION OF PRINTED WIRING BOARD USING THE LAMINATE

(75) Inventors: Takabumi Omori, Tokyo (JP); Mitsuru Nozaki, Tokyo (JP); Eiji Nagata, Yokohama (JP); Masashi Yano, Yokohama (JP)

(73) Assignees: Mitsubishi Gas Chemical Company, Inc., Tokyo (JP); PI R&D Co., Ltd., Kanagawa-ken (JP)

( * ) Notice: Subject to any disclaimer, the term of this patent is extended or adjusted under 35 U.S.C. 154(b) by 138 days.

This patent is subject to a terminal disclaimer.

(21) Appl. No.: 11/224,021

(22) Filed: Sep. 13, 2005

(65) Prior Publication Data

US 2006/0054589 A1    Mar. 16, 2006

(30) Foreign Application Priority Data

| Sep. 14, 2004 | (JP) | ............................. 2004-266212 |
| Dec. 14, 2004 | (JP) | ............................. 2004-360790 |
| Aug. 24, 2005 | (JP) | ............................. 2005-242431 |

(51) Int. Cl.
 B32B 15/08    (2006.01)
 B32B 27/06    (2006.01)
 C23C 18/54    (2006.01)

(52) U.S. Cl. .................. 428/473.5; 428/901; 427/97.6; 427/99.5

(58) Field of Classification Search .................. 428/216, 428/435, 473.5, 606, 607
See application file for complete search history.

(56) References Cited

U.S. PATENT DOCUMENTS

| 4,839,232 | A  |   | 6/1989  | Morita et al. |
| 5,739,263 | A  | * | 4/1998  | Yoshida et al. ............... 528/353 |
| 6,251,507 | B1 | * | 6/2001  | Yamamoto et al. .......... 428/215 |
| 6,458,912 | B1 | * | 10/2002 | Kuroki et al. ................ 528/170 |
| 6,630,064 | B1 | * | 10/2003 | Itatani et al. ................. 204/489 |
| 2003/0072954 | A1 |  | 4/2003 | Ozawa et al. |
| 2003/0211345 | A1 |  | 11/2003 | Shiotani et al. |
| 2004/0019174 | A1 | * | 1/2004 | Ichiroku et al. ................ 528/25 |
| 2005/0272907 | A1 | * | 12/2005 | Jin et al. ....................... 528/310 |

FOREIGN PATENT DOCUMENTS

| CA | 2048321   | A | * | 2/1992 |
| EP | 0 470 049 | A2 |  | 2/1992 |
| JP | 61143433  | A | * | 7/1986 |
| JP | 02222716  | A | * | 9/1990 |
| JP | 05271443  |   | * | 10/1993 |
| JP | 05299850  |   | * | 11/1993 |
| JP | 10001541  | A | * | 1/1998 |

OTHER PUBLICATIONS

Database WPI Section Ch, Week 199350, Derwent Publications Ltd., London, GB; AN 1993-399064 XP002364597, abstract of JP 05 299848, Nov. 12, 1993.
Database WPI Section Ch, Week 199301, Derwent Publications Ltd., London, GB; AN 1993-005309 XP002364598, abstract of JP 04 334090, Nov. 20, 1992.
Database WPI Section Ch, Week 200036, Derwent Publications Ltd., London, GB; AN 1993-005308 XP002364599, abstract of JP 03 059248, Jul. 4, 2000.
Database WPI Section Ch, Week 199244, Derwent Publications Ltd., London, GB; AN 1992-362847 XP002364600, abstract of JP 04 266082, Sep. 22, 1992.
Database WPI Section Ch, Week 199214, Derwent Publications Ltd., London, GB; AN 1992-109242 XP002364601, abstract of JP 04 050279, Feb. 19, 1992.
Database WPI Section Ch, Week 199213, Derwent Publications Ltd., London, GB; AN 1992-102399 XP002364602, abstract of JP 04 046983, Feb. 17, 1992.

* cited by examiner

*Primary Examiner*—Callie E Shosho
*Assistant Examiner*—John Freeman
(74) *Attorney, Agent, or Firm*—Wenderoth, Lind & Ponack, L.L.P.

(57) ABSTRACT

A resin composite metal foil comprising a metal foil and a layer of a block copolymer polyimide resin formed on one surface of the metal foil, a metal-foil-clad laminate using the above resin composite metal foil, a printed wiring board using the above metal-foil-clad laminate, and a process for the production of a printed wiring board comprising removing an external layer metal foil of a metal-foil-clad laminate and forming a conductor layer on an external layer insulating layer by plating, wherein the metal-foil-clad laminate comprises a layer of a block copolymer polyimide resin which layer is in contact with the external layer metal foil.

13 Claims, No Drawings

RESIN COMPOSITE METAL FOIL, LAMINATE AND PROCESS FOR THE PRODUCTION OF PRINTED WIRING BOARD USING THE LAMINATE

FIELD OF THE INVENTION

The present invention relates to a resin composite metal foil for use in a printed wiring board, a metal-foil-clad laminate and a printed wiring board each of which uses the resin composite metal foil, and a process for the production of a printed wiring board whose external layer conductor layer is formed by plating.

A metal foil having a metal foil surface with extremely small roughness can be used for the resin composite metal foil obtained by the present invention. The resin composite metal foil has an excellent adhesive strength to a resin composition. The metal-foil-clad laminate obtained therefrom has excellent heat resistance and is suitably used for a high-density printed wiring board having a fine circuit.

A printed wiring board obtained by the process for the production of a printed wiring board provided by the present invention is excellent in the adhesive strength between an external layer conductor layer and an external layer insulating layer and the surface roughness of the external layer insulating layer may be extremely small. Therefore, the above printed wiring board is suitably used as a high-density printed wiring board having a fine circuit.

BACKGROUND OF THE INVENTION

In recent years, with regard to electronic equipment which is decreasing in size, thickness and weight, needs for a printed wiring board having a high density are more and more increasing. In accordance with the above needs, an improvement of a metal foil to be used is also required for the purpose of forming a fine circuit. Conventionally, as a method of forming a circuit, there has been adopted a subtractive process in which a circuit is formed by etching a metal foil or a (semi) additive process in which a conductor layer is formed on an insulating layer by plating. In the subtractive process, however, for making the adhesive strength between a metal foil and a B-stage resin composition become fine, a metal foil having a mat surface with remarkable roughness and having a high adhesive strength to an insulating layer is used. For this reason, there is a problem that, when a fine circuit is formed, part of convex portions is apt to remain on a resin surface of a laminate under the influence of the roughness of the mat surface of the metal foil. When an etching time is extended for removing the convex portions completely, the circuit is over-etched and the location accuracy of the circuit and adhesive strength decrease. As a means for overcoming the above problems, a so-called low profile metal foil of which the mat surface roughness is lowered has been realized. However, the above metal foil is originally weak in adhesive strength. When this metal foil is applied to a metal-clad laminate using a high heat resistant thermosetting resin, etc., a problem concerning fine circuits is that adhesive strength is insufficient. This problem is an obstacle to development of a printed wiring board having a high density. Further, as an example of use of a metal foil with an adhesive, e.g., a copper foil with an adhesive, there are proposed a copper-clad laminate using a copper foil having a thin adhesive layer formed thereon (for example JP-A-8-216340) and a copper-clad laminate using a copper foil to which a semi-cured resin film is bonded (for example JP-A-9-11397). However, these copper-clad laminates have problems in view of the level of adhesive strength and heat resistance after moisture absorption so that further improvements are required.

In the (semi) additive method, a roughening treatment of an insulating layer is required before plating for increasing the adhesive strength between the insulating layer and a conductor layer (for example JP-A-2003-69218 and JP-A-2003-249751). In this case, the step of forming a circuit becomes complicated. In addition, when a fine circuit is formed, a problem is that the accuracy of the formation of the circuit is apt to decrease because of an increase in the roughness of a surface. Further, there is disclosed a production process of a printed wiring board comprising forming a high heat resistant insulating resin layer as an outermost layer of a core base material and forming a conductor circuit on the insulating resin layer (for example JP-A-2004-6773). This production process requires a roughening treatment of the insulating layer so that this process cannot overcome the conventional problems.

SUMMARY OF THE INVENTION

It is an object of the present invention to provide a resin composite metal foil, such as a resin composite copper foil, which can use a metal foil having a metal foil surface with extremely small roughness and is excellent in the adhesive strength to a resin composition of a copper-clad laminate and provide a metal-foil-clad laminate which uses the above resin composite metal foil and is excellent in heat resistance and heat resistance after moisture absorption and a printed wiring board using the above metal-foil-clad laminate.

It is an object of the process for the production of a printed wiring board, provided by the present invention, to provide a process for the production of a printed wiring board which is excellent in the adhesive strength between an external layer conductor layer and an insulating layer, whose external layer insulating layer has an extremely small surface roughness and which is suited for forming a fine circuit.

The present invention provides a resin composite metal foil comprising a metal foil such as a copper foil and a layer of a block copolymer polyimide resin formed on one surface of the metal foil, wherein the block copolymer polyimide resin is preferably a block copolymer polyimide resin having structural units represented by the following formula (1) and the following formula (2). Further, the present invention provides a metal-foil-clad laminate obtained by laminate-molding the above resin composite metal foil and a B-stage resin composition layer and a printed wiring board using the above metal-foil-clad laminate.

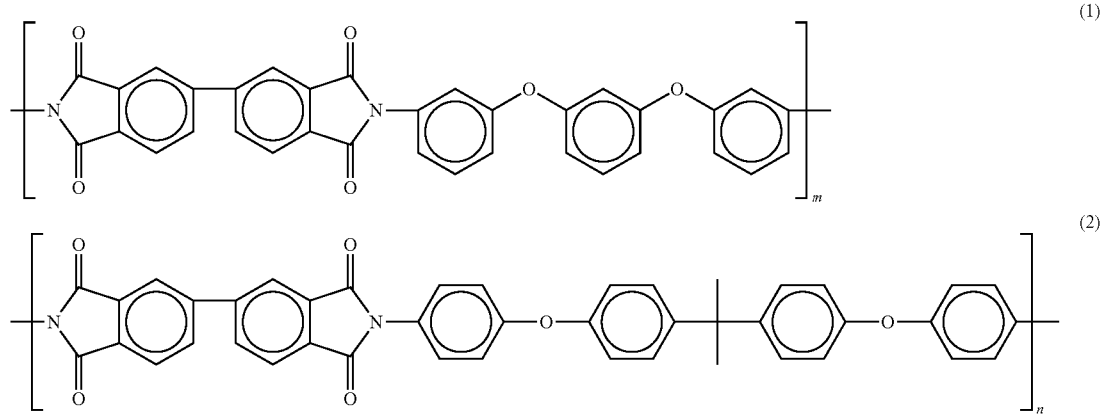

wherein m and n are integers which satisfy m:n=1:9 to 3:1.

The present invention further provides a process for the production of a printed wiring board comprising removing an external layer metal foil of a metal-foil-clad laminate and forming a conductor layer on an external insulating layer by plating, wherein the metal-foil-clad laminate comprises a layer of a block copolymer polyimide resin which layer is in contact with the external layer metal foil. Further, the present invention provides a process for the production of a printed wiring board according to the above process, wherein the conductor layer is formed by plating without carrying out a roughening treatment of the external layer insulating layer after completely removing the external layer metal foil of the metal-foil-clad laminate. In the above processes, the block copolymer polyimide resin is preferably a block copolymer polyimide resin having structural units represented by the above formula (1) and the above formula (2). The present invention furthermore provides a process according to the above process, wherein, in the formation of the conductor layer on the external layer insulating layer by plating, electroless plating is carried out and then heating is carried out at 100 to 170° C. The present invention still further provides a process according to the above process, wherein the conductor layer is formed on the external layer insulating layer by plating according to a semi-additive process or a subtractive process.

EFFECT OF THE INVENTION

According to the resin composite metal foil of the present invention, a metal foil having a metal foil surface with extremely small roughness can be used and there is provided a metal-foil-clad laminate which is excellent in the adhesive strength to a resin composition of a copper-clad laminate. Further, the use of the above resin composite metal foil can provide a metal-foil-clad laminate which is excellent in heat resistance and heat resistance after moisture absorption. The above metal-foil-clad laminate is suitably used as a high-density printed wiring board having a fine circuit. Therefore, the resin composite metal foil of the present invention has remarkably high industrial practical utilities.

A printed wiring board obtained according to the process for the production of a printed wiring board, provided by the present invention, is excellent in the adhesive strength between an external layer conductor layer and an insulating layer so that the step of roughening an insulating layer, which step has been required, is unnecessary. For this reason, it is possible to keep the surface roughness of an external layer insulating layer extremely small. Therefore, the above printed wiring board is the most suitable for a high-density printed wiring board having a fine circuit and the process provided by the present invention has remarkably high industrial practical utilities.

DETAILED DESCRIPTION OF THE INVENTION

The present inventors have made diligent studies for overcoming the above objects and as a result found that a metal-foil-clad laminate excellent in adhesive strength and heat resistance can be obtained by using a resin composite metal foil obtained by forming a layer of a block copolymer polyimide resin on one surface of a metal foil. On the basis of the above finding, the present inventors have arrived at the present invention.

The block copolymer polyimide resin which is used in the resin composite metal foil of the present invention or which is formed so as to be in contact with the external layer metal foil of the metal-foil-clad laminate will be explained hereinafter.

The block copolymer polyimide resin is not specially limited so long as it is a copolymer polyimide resin having a structure in which an imide oligomer formed of a second structural unit is bonded to a terminal of an imide oligomer formed of a first structural unit. The block copolymer polyimide resin is synthesized by a sequential polymerization reaction in which a tetracarboxylic dianhydride is reacted with a diamine in a polar solvent to obtain an imide oligomer and then the same kind of tetracarboxylic dianhydride and a different kind of diamine are further added or a different kind of tetracarboxylic dianhydride and the same kind of diamine are further added to carry out imidization. The polar solvent to be used includes polar solvents which dissolve polyimide such as N-methyl-2-pyrrolidone, dimethylacetamide, dimethylformamide, dimethyl sulfoxide, sulfolane and tetramethyl urea. Further, it is possible to mix a ketone solvent or an ether solvent with the above polar solvent. The ketone solvent usable in the present invention includes methyl ethyl ketone, methyl propyl ketone, methyl isopropyl ketone, methyl butyl ketone, methyl isobutyl ketone, methyl-n-hexylketone, diethyl ketone, diisopropyl ketone, diisobutyl ketone, cyclopentanone, cyclohexanone, methyl cyclohexanone, acetylacetone, diacetone alcohol and cyclohexene-n-on. The ether solvent usable in the present invention includes dipropyl ether, diisopropyl ether, dibutyl ether, tetrahydrofuran, tetrahydropyran, ethyl isoamyl alcohol, ethyl-t-butylether, ethyl benzyl ether, diethylene glycol dimethyl ether, cresyl methyl ether, anisole and phenetole. Further, for the purpose of removing water which generates in the imidization reaction, it is required to add a solvent which is azeotropic with water such as toluene or xylene and remove the generated water from the reaction solution. Further, an amine type catalyst such as pyridine or a binary catalyst comprising a base and a cyclic ester such as pyridine and γ-valerolactone is preferably used for the purpose of promoting the reaction. The reaction temperature is from 120 to 200° C. A polar solvent solution of the block copolymer polyimide resin alone can be obtained by finally distilling off the solvent which is azeotropic with water such as toluene or xylene and the catalyst such as pyridine from the reaction solution.

The block copolymer polyimide resin used in the present invention is preferably a block copolymer polyimide resin having a structural unit of the formula (1) and a structural unit of the formula (2). The tetracarboxylic dianhydride used in the block copolymer polyimide resin is preferably 3,4,3',4'-biphenyltetracarboxylic dianhydride and the diamine used in the block copolymer polyimide resin is preferably 1,3-bis(3-aminophenoxy)benzene and 2,2-bis{4-(4-aminophenoxy)phenyl}propane. Further, for the purpose of controlling the molecular weight of each unit polycondensate, the molar ratio between the tetracarboxylic dianhydride and the diamine is shifted in a first stage reaction to convert terminals into an acid anhydride or an amine and then the molar ratio used in the first stage reaction between the tetracarboxylic dianhydride and the diamine is reversed in a second stage reaction, whereby a block copolymer polyimide having a sufficient molecular weight can be obtained. The weight average molecular weight (Mw) of the block copolymer polyimide resin of the present invention is preferably 50,000 to 300,000, more preferably 80,000 to 200,000. When Mw is smaller than 50,000, the polyimide resin layer is fragile and therefore is not suitable for attaining the object of the present invention. When Mw is larger than 300,000, a solution viscosity becomes too high and therefore application is difficult. Further, it is also possible to synthesize the block copolymer polyimide resin by shifting the molar ratio of tetracarboxylic dianhydride and diamine for controlling the final molecular weight.

With regard to the molar ratio between unit polycondensate of the formula (1) and unit polycondensate of the formula (2), formula (1): formula (2) is preferably from 1:9 to 3:1, more preferably from 2:3 to 3:2. When the percentage of the structure of the formula (1) is less than 10 mol %, a problem is a decrease in adhesive strength. When the percentage of the structure of the formula (2) is less than 25 mol %, a problem is a decrease in soldering heat resistance.

The metal foil used in the resin composite metal foil of the present invention is not specially limited so long as it is a known metal foil usable for a printed wiring board. An electrolytic copper foil, a rolled copper foil and copper alloys of these are preferably used. There may be also used copper foils obtained by subjecting the above copper foils to a known surface-treatment such as a nickel treatment or a cobalt treatment. The thickness of the metal foil is not specially limited. It is preferably 35 μm or less. The surface roughness (Rz) of a metal foil surface (mat surface in the case of electrolytic copper foil) on which the layer of the block copolymer polyimide resin is to be formed is preferably 4 μm or less, more preferably 3 μm or less. Rz is a 10-points average roughness defined by JIS B0601.

The metal foil used as an external layer of the metal-foil-clad laminate used in the present invention is not specially limited so long as it is a known copper foil or a known aluminum foil which is usable for a printed wiring board. An electrolytic copper foil, a rolled copper foil and copper alloys of these, or a soft aluminum foil and a hard aluminum foil are preferably used. There may be also used metal foils obtained by subjecting the above metal foils to a known surface-treatment such as a nickel treatment or a cobalt treatment. The thickness of the metal foil is not specially limited. It is preferably 35 μm or less when a copper foil is used. Further, it is preferably 100 μm or less when an aluminum foil is used. The surface roughness (Rz) of a surface of the external layer metal foil which surface is to be brought into contact with the block copolymer polyimide resin layer is preferably 4 μm or less, more preferably 3 μm or less.

The metal-foil-clad laminate used in the present invention is not specially limited so long as it is a metal-foil-clad laminate which comprises the above block copolymer polyimide resin layer which is formed so as to be in contact with its external layer metal foil. For example, there are preferably used a metal-foil-clad laminate having a layer of a different resin composition (to be simply referred to as "resin composition" hereinafter) other than the block copolymer polyimide resin which layer is formed on a surface of the block copolymer polyimide resin layer which surface is opposite to a surface thereof to be in contact with the metal foil, and an internal-layer-circuit-inserted metal-foil-clad laminate having an internal layer substrate having a conductor circuit formed inside a resin composition layer.

The thickness of the layer of the block copolymer polyimide resin which is used in the resin composite metal foil of the present invention or which is formed so as to be in contact with the external layer metal foil of the metal-foil-clad laminate can be adjusted according to the degree of the surface roughness of copper foil or metal foil. However, when the block copolymer polyimide resin layer is too thick, drying at a heating step at the time of forming the polyimide resin layer is apt to be insufficient and the heat resistance of copper-clad laminate or metal-foil-clad laminate used decreases in some cases. Therefore, the above thickness is from 0.1 to 10 μm, preferably from 1 to 10 μm, more preferably from 2 to 7 μm.

The resin composite metal foil of the present invention is produced by directly applying a polar solvent solution of the block copolymer polyimide resin, obtained according to the aforementioned synthesis method, to one surface of the metal foil and drying the applied solution. As an application method, there can be used a variety of methods such as reverse roll, rod (bar), blade, knife, die, gravure and rotary screen. A drying machine for the drying is not specially limited so long as it is capable of generating a temperature sufficient for removing the solvent used. It is typically a hot-air dryer or an infrared ray drier. For preventing the oxidation of the metal foil, it is possible to adopt a method in which drying is carried out at 200° C. or lower for a long time or to carry out drying at a further high temperature in vacuum or in an inert atmosphere such as a nitrogen atmosphere.

A resin composition used in the B-stage resin composition layer which is laminate-molded together with the resin composite metal foil of the present invention or preferably used in the metal-foil-clad laminate used in the present invention is not specially limited so long as it is a known thermosetting resin composition usable for a printed wiring board. Examples of such a resin include an epoxy resin, a polyimide resin, a cyanate ester resin, a maleimide resin, a double-bond-added polyphenylene resin, and resins such as bromides of these resins and phosphorus-containing compounds of these resins. These may be used alone or in combination. It is preferable to use a resin composition containing a cyanate ester resin as an essential component, such as a resin composition containing for example an epoxy resin in combination with the cyanate ester resin, in view of reliability such as migration resistance and heat resistance. It is possible to use a known catalyst, a curing agent or a curing accelerator for these thermosetting resins as required.

The cyanate ester resin which is preferably used in the above resin composition refers to a compound whose molecule contains at least two cyanato groups. Specific examples of the cyanate ester resin includes 1,3- or 1,4-dicyanatobenzene, 1,3,5-tricyanatobenzene, 1,3-, 1,4-, 1,6-, 1,8-, 2,6- or 2,7-dicyanatonaphthalene, 1,3,6-tricyanatonaphthalene, 4,4-dicyanatobiphenyl, bis(4-dicyanatophenyl)methane, 2,2-bis (4-cyanatophenyl)propane, 2,2-bis(3,5-dibromo-4-cyanotophenyl)propane, bis(4-cyanatophenyl)ether, bis(4-cyanatophenyl)thioether, bis(4-cyanatophenyl)sulfone, tris (4-cyanatophenyl)phosphite, tris(4-cyanatophenyl) phosphate, and cyanates obtained by a reaction between novolak and cyan halide.

In addition to these compounds, the above cyanate ester resin can be also selected from cyanate ester compounds disclosed in Japanese Patent Publications Nos. 41-1928, 43-18468, 44-4791, 45-11712, 46-41112 and 47-26853 and JP-A-51-63149. Further, naphthalene type cyanate ester compounds may be also used. Furthermore, there may be also used a prepolymer having a triazine ring formed by trimerization of cyanato groups of the above cyanate ester compounds and having a molecular weight of 400 to 6,000. The above prepolymer can be obtained by polymerizing the above cyanate ester monomer in the presence of a catalyst selected from acids such as mineral acids and Lewis acids; bases such as sodium alcoholate and tertiary amines; or salts such as sodium carbonate. This resin contains partially unreacted monomer and is in the form of a mixture of monomer with prepolymer, and this material can be suitably used in the present invention. Moreover, a cyanato-modified polyphenylene ether resin may be also used. It is possible to incorporate about 1 to 10% by weight of a monofunctional cyanate ester compound into the above cyanate ester resin. The cyanate ester resin is not limited to the above examples and may be selected from known cyanate ester resins. These cyanate ester resins may be used alone or in combination.

The epoxy resin which is preferably used in combination with the cyanate ester resin can be generally selected from known epoxy resins. Specific examples of the epoxy resin include a bisphenol A type epoxy resin, a bisphenol F type epoxy resin, a phenol novolak type epoxy resin, a cresol novolak type epoxy resin, an alicyclic epoxy resin, a biphenyl type epoxy resin, a fluorene type epoxy resin, a resorcine type epoxy resin, a naphthalene type epoxy resin, a phenol aralkyl type epoxy resin, a biphenyl aralkyl type epoxy resin, an epoxydized polyphenylene ether resin; polyepoxy compounds prepared by epoxidizing the double bond of butadiene, pentadiene, vinylcyclohexene and dicyclopentyl ether; and polyglycidyl compounds obtained by a reaction of a polyol, hydroxyl-group-containing silicone resins and epichlorohydrin. Further, there may be also used known bromine-added resins of these epoxy resins and a phosphorus-containing epoxy resin. These epoxy resins may be used alone or in combination as required.

The resin composition used in the above resin composition layer may further contain a variety of additives as required so long as the inherent properties of the composition are not impaired. Examples of the above additives include monomers having a polymerizable double bond, such as an unsaturated polyester, and prepolymers thereof; liquid rubbers having a low molecular weight and elastic rubbers having a high molecular weight such as polybutadiene, maleated butadiene, a butadiene-acrylonitrile copolymer, polychloroprene, a butadiene-styrene copolymer, polyisoprene, butyl rubber, fluorine rubber and natural rubber; polyethylene, polypropylene, polybutene, poly-4-methylpentene, polystyrene, an AS resin, an ABS resin, an MBS resin, styrene-isoprene rubber, acrylic rubber, core shell rubbers of these, a polyethylene-propylene copolymer and ethylene tetrafluoride-ethylene hexafluoride copolymers; prepolymers or oligomers having a high molecular weight such as polycarbonate, polyphenylene ether, polysulfone, polyester and polyphenylene sulfide; and polyurethane. The above additives are used as required.

In addition, it is also possible to incorporate various additives such as a known inorganic or organic filler, a dye, a pigment, a thickener, a lubricant, an anti-foamer, a dispersing agent, a leveling agent, a photosensitizer, a flame retardant, a brightener, a polymerization inhibitor and a thixotropic agent. These additives may be used alone or in combination as required. A curing agent or a catalyst is incorporated into a compound having a reactive group, as required. In particular, when holes are made with a carbon dioxide gas laser, an inorganic filler is preferably incorporated for improving the form of the holes. Example of the inorganic filler include generally known inorganic fillers such as silica, spherical silica, alumina, talc, calcined talc, wollastonite, synthesized mica, titanium oxide and aluminum hydroxide. Further, these inorganic filler may have a known shape such as a needle shape.

It is preferable to use a base material in the resin composition layer from the viewpoint of the properties of a printed wiring board obtained by the present invention. The base material is not specially limited so long as it is a known base material usable for a printed wiring board. Specific examples of the base material include nonwoven fabrics and woven fabrics of glass fibers such as E glass, NE glass, D glass, S glass and T glass, nonwoven fabrics and woven fabrics of organic fibers such as aramid, liquid crystal polyester and polybenzoxazole, and organic films such as a polyimide film, a wholly aromatic polyamide film, a liquid crystal polyester film and a porous Teflon (trade mark) film. It is preferred to subject the base material to a known surface treatment for improving the adhesion to the resin composition.

With regard to the metal-foil-clad laminate used in the present invention, a method of forming the aforementioned block copolymer polyimide resin layer so as to be brought into contact with the external layer metal foil is not specially limited. For example, there may be adopted a method in which a polar solvent solution of the block copolymer polyimide resin, obtained according to the aforementioned synthesis method, is applied to one surface of the metal foil and then dried to obtain a resin composite metal foil, and the thus-obtained resin composite metal foil is used as it is or the resin composite metal foil is integrated with the resin composition layer or a method in which a polar solvent solution of the block copolymer polyimide resin is applied to a release film or the resin composition layer and then dried to prepare a block copolymer polyimide resin film or a block copolymer polyimide resin-applied resin composition layer and the block copolymer polyimide resin film or the block copolymer polyimide resin-applied resin composition layer is integrated with the metal foil.

The method for producing the B-stage resin composition layer used in the present invention is not specially limited. For example, the B-stage resin composition layer is produced by a known method such as a method in which a varnish of thermosetting resin composition is prepared by dissolving or dispersing the thermosetting resin composition in a solvent or by using no solvent, and the varnish is applied to one surface of a release film and dried to obtain a B-stage resin composition sheet, a method in which the above varnish is applied to a base material and then B-staged by drying to prepare a prepreg or a method in which the above varnish is directly applied to a substrate having a conductor circuit and then dried to form a B-stage resin composition layer. The thickness of the B-stage resin composition layer is not specially limited. In the case of the sheet, it is preferably 4 to 150 μm. In the case of the direct application to the substrate, it is also preferably 4 to 150 μm. In the case of the prepreg, it is preferably 10 to 200 μm.

The method of producing a copper-clad laminate or the metal-foil-clad laminate in the present invention will be explained with reference to a case using a resin composite copper foil. The resin composite copper foil is disposed on the above-mentioned B-stage resin composition layer such that the resin layer surface of the resin composite copper foil faces to the B-stage resin composition layer and the resultant set is laminate-molded. Specifically, the resin composite copper foil is disposed on at least one surface of the B-stage resin composition layer or a material obtained by disposing or forming the B-stage resin composition layers on both surfaces of a laminate, one B-stage resin composition layer on each surface, such that the resin layer surface of the resin composite copper foil faces to the B-stage resin composition layer, and the resultant set is laminate-molded under heat and under pressure, preferably in vacuum, to obtain a copper-clad laminate. In the case of the production of a multilayer board, the B-staged resin composition layers are disposed or formed on both surfaces of an internal layer substrate having conductor circuits formed, one B-stage resin composition layer on each surface, the resin composite copper foils are disposed on the B-stage resin composition layers on both the surfaces, one resin composite copper foil on each surface, such that the resin layer surfaces of the resin composite copper foils face to the B-stage resin composition layers respectively, and the resultant set is laminate-molded under heat and under pressure, preferably in vacuum, to obtain a multilayer copper-clad laminate. A conductor circuit is formed in the above copper-clad laminate or multilayer copper-clad laminate by a known method, followed by plating treatment, etc., to obtain a printed wiring board.

The laminate or circuit substrate used for the above productions is not specially limited in kind and can be selected from known laminates and metal-foil-clad boards, preferably copper-clad boards, for a printed wiring board material. Specifically, there may be used known laminates and substrates such as an inorganic-fiber and/or organic-fiber base material copper-clad laminate using a thermosetting resin composition and/or a thermoplastic resin composition, a heat-resistant film base material copper-clad board, composite base material copper-clad laminates obtained by combining these base materials, multilayer copper-clad boards of these, and a multilayer copper-clad board produced by the additive process or the like. The conductor thickness of the circuit substrate is not specially limited. It is preferably 3 to 35 μm. A known treatment which increases the adhesion to resin of the B-stage resin composition layer, such as a black copper oxide treatment or a treatment with a chemical (for example, CZ treatment by MECK), is preferably made on this conductor circuit.

In the present invention, the lamination conditions are not specially limited. The laminate-molding is preferably carried out at a temperature of 100 to 250° C. at a pressure of 5 to 40 kgf/cm$^2$ under a vacuum degree of 30 mmHg or less for 30 minutes to 5 hours. The lamination may be carried out under the above conditions from first to last. It is also possible to carry out laminate-molding till gelation, then take out a resultant material and post-cure it in a heating furnace.

In the process for the production of a printed wiring board, provided by the present invention, the metal foil as an external layer of the above metal-foil-clad laminate or internal-layer-circuit-inserted metal-foil-clad laminate is completely removed by etching or the like and then the conductor layer is formed by plating. In this case, it is possible to omit a roughening treatment of external layer insulating layer after the removal of the metal foil. As a method for removing the metal foil as an external layer of the metal-foil-clad laminate or internal-layer-circuit-inserted metal-foil-clad laminate by etching, there may be adopted a known method such as a method using a solution of ferric chloride, copper chloride or an ammonium persulfate.

Concerning general production processes of a printed wiring board in which a conductor layer is formed by plating, a roughening treatment of an external layer insulating layer is essentially required and there is adopted a dry method, a wet method or a combinational treatment method of these methods. Specifically, concerning the wet method, there is known a roughening treatment with a chemical such as an alkaline permanganic acid solution; an oxidizer solution, e.g., dichromate salt, ozone, hydrogen peroxide/sulfuric acid, or nitric acid; or a strong alkaline solution. Concerning the dry method, there are known a roughening treatment by mechanical polishing such as buffing or sandblasting and a roughening treatment by plasma-etching. However, none of these roughening treatments are required in the present invention. Since the roughening treatment is unnecessary, the process for the production of a printed wiring board, provided by the present invention, can simplify production steps and also largely decrease environmental loading.

In the process for the production of a printed wiring board, provided by the present invention, a dry plating method or a wet plating method may be used as a method of forming the conductor layer on the external layer insulating layer by plating. Examples of the dry plating method include a vacuum evaporation method, a sputtering method and an ion plating method. As the wet plating method, there may be adopted a known method such as electroless plating or a combinational method of electroless plating and electrolytic plating. Of these methods, the combinational method of electroless plating and electrolytic plating is preferable. Specifically, after removing the metal foil as an external layer of the metal-foil-clad laminate or internal-layer-circuit-inserted metal-foil-clad laminate completely, electroless plating is carried out without carrying out a roughening treatment of the external layer insulating layer and then electrolytic plating is carried out, to produce a conductor layer. In this case, it is preferable to carry out drying after the electroless plating for removing an included water content. With regard to conditions for the above drying after the electroless plating, it is sufficient to adopt conditions under which the water content is removed. Preferably, heating at from 100° C. to 170° C. for from 1 to 5 hours can remove the water content and at the same time further improve the adhesive strength between the conductor layer and the insulating layer. Thereafter, a step of forming a circuit by pattern-processing the conductor layer is carried out according to the known additive process or semi-additive process, etc., whereby a printed wiring board is produced. Specifically, in the case of forming a pattern by the additive process, a conductor layer is entirely formed by panel plating and then the conductor layer is selectively removed using an etching resist to form the pattern. In the case of forming a pattern by the semi-additive process, a thin conductor layer is formed by electroless plating or the like, then electrolytic plating is selectively carried out using a plating resist to form pattern plating, then the resist is removed, and the entire surface is etched to a proper extent, to form the pattern. Further, for the purpose of stabilization, the adhesive strength between external layer conductor layer and insulating layer can be increased by carrying out heat treatment at 150 to 200° C. for 20 to 90 minutes after the formation of the pattern.

EXAMPLES

The present invention will be specifically explained with reference to Examples and Comparative Examples hereinafter.

Example 1

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 117.68 g (400 mmol) of 3,4,3',4'-biphenyltetracarboxylic dianhydride, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (to be referred to as "NMP" hereinafter) and 20 g of toluene. The mixture was heated at 180° C. for 1 hour and then cooled down to about room temperature. 29.42 g (100 mmol) of 3,4,3',4'-biphenyltetracarboxylic dianhydride, 82.12 g (200 mmol) of 2,2-bis{4-(4-aminophenoxy)phenyl}propane, 200 g of NMP and 40 g of toluene were added and the components were mixed at room temperature for 1 hour and then heated at 180° C. for 3 hours, to obtain a block copolymer polyimide resin solution having a solid content of 38%. The block copolymer polyimide resin had a formula (1): formula (2) ratio of 3:2, a number average molecular weight of 70,000 and a weight average molecular weight of 150,000. The block copolymer polyimide resin solution was further diluted with NMP to prepare a block copolymer polyimide resin solution having a solid content of 15%.

This block copolymer polyimide resin solution was applied to a mat surface of an electrolytic copper foil (F0-WS foil, Rz=1.5 μm, supplied by Furukawa circuit foil Co., Ltd.) having a thickness of 12 μm with a reverse roll coating machine. The applied solution was dried under a nitrogen atmosphere at 120° C. for 3 minutes and 160° C. for 3 minutes and then lastly heated at 260° C. for 3 minutes, whereby resin composite copper foils were prepared. On the other hand, 400 g of 2,2-bis(4-cyanatophenyl) propane was molten at 150° C. and allowed to react with stirring for 4 hours, the resultant reaction product was dissolved in methyl ethyl ketone and 600 g of a brominated bisphenol A type epoxy resin (EPICLON 1123P, supplied by Dainippon Ink and Chemicals, Incorporated) and 0.1 part of zinc octylate were added to prepare a varnish. The varnish was impregnated into a glass woven fabric base material having a thickness of 100 μm and heated at 150° C. for 6 minutes, whereby B-stage resin composition layers (prepregs) having a resin amount of 45%, a thickness of 105 μm and a gelation time (at 170° C.) of 120 seconds were prepared. Four prepregs were stacked. The above resin composite copper foils were placed on the upper surface and lower surface of the stacked prepregs, one copper foil on each surface, such that the resin layer surfaces of the resin composite copper foils faced to the upper and lower surfaces of the stacked prepregs, and the resultant set was laminate-molded at a temperature of 220° C. at a pressure of 40 kgf/cm² and under a vacuum degree of 30 mmHg or less for 1 hour, to obtain a copper-clad laminate having a thickness of 0.4 mm. Table 1 shows the evaluation results.

Example 2

A copper-clad laminate having a thickness of 0.4 mm was produced in the same manner as in Example 1 except that the F0-WS foil as an electrolytic copper foil used in Example 1 was replaced with F3-WS foil (Rz=2.4 μm, supplied by Furukawa circuit foil Co., Ltd.) having a thickness of 12 μm. Table 1 shows the evaluation results.

Example 3

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 117.68 g (400 mmol) of 3,4,3',4'-biphenyltetracarboxylic dianhydride, 123.18 g (300 mmol) of 2,2-bis{4-(4-aminophenoxy)phenyl}propane, 4.0 g (40 mmol) of γ-valerolactone, 4.8 g (60 mmol) of pyridine, 300 g of NMP and 20 g of toluene. The mixture was heated at 180° C. for 1 hour and then cooled down to about room temperature. Then, 29.42 g (100 mmol) of 3,4,3',4'-biphenyltetracarboxylic dianhydride, 58.47 g (200 mmol) of 1,3-bis(3-aminophenoxy)benzene, 200 g of NMP and 40 g of toluene were added and the components were mixed at room temperature for 1 hour and then heated at 180° C. for 3 hours, to obtain a block copolymer polyimide resin solution having a solid content of 38%. The block copolymer polyimide resin had a formula (1): formula (2) ratio of 2:3, a number average molecular weight of 75,000 and a weight average molecular weight of 160,000. The block copolymer polyimide resin solution was further diluted with NMP to prepare a block copolymer polyimide resin solution having a solid content of 15%. Then, resin composite copper foils were prepared in the same manner as in Example 1 except that this block copolymer polyimide resin solution was used. The procedures thereafter were carried out in the same manner as in Example 1, to prepare a copper-clad laminate having a thickness of 0.4 mm. Table 1 shows the evaluation results.

Example 4

A copper-clad laminate having a thickness of 0.4 mm was produced in the same manner as in Example 3 except that the electrolytic copper foil used in Example 3 was replaced with a rolled copper foil (As Rolled, Rz=1.0 μm, supplied by Japan Energy Corporation) having a thickness of 12 μm. Table 1 shows the evaluation results.

Comparative Example 1

Four prepregs which were the same as the prepreg obtained in Example 1 were stacked. 12 μm thick electrolytic copper foils (F0-WS foil) were disposed on the upper surface and lower surface of the stacked prepregs, one copper foil on each surface, and the resultant set was laminate-molded for 1 hour at 220° C. at a pressure of 40 kgf/cm² and at a vacuum degree of 30 mmHg or less, to prepare a copper-clad laminate. Table 2 shows the evaluation results.

Comparative Example 2

1,000 g of methyl ethyl ketone was added to 400 g of a bisphenol A type epoxy resin (Epikote 1001, supplied by Japan Epoxy Resins Co., Ltd.), 300 g of a bisphenol A type epoxy resin (Epikote 828, supplied by Japan Epoxy Resins Co., Ltd.), 300 g of low-molecular-weight liquid rubber (CTBN1300×31, supplied by UBE INDUSTRIES, LTD) and 10 g of 2-ethyl-4-methylimidazole (supplied by Shikoku Corporation) and the components were stirred and dissolved at room temperature for 1 hour to obtain a varnish. The varnish was applied to a mat surface of an electrolytic copper foil (F0-WS foil) having a thickness of 12 μm with a reverse roll coating machine and dried under heat in a heating furnace at 150° C. for 10 minutes, whereby epoxy resin type resin composite copper foils were prepared. The procedures thereafter were carried out in the same manner as in Example 1 except that the above epoxy resin type resin composite copper foils were used in place of the resin composite copper foils of the block copolymer polyimide resin used in Example 1, to obtain a copper-clad laminate having a thickness of 0.4 mm. Table 2 shows the evaluation results.

Comparative Example 3

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 164 g (400 mmol) of ethylene glycol bistrimellitate dianhydride, 124 g (400 mmol) of 4,4'-diamino-3,3',5,5'-tetraethyldiphenylmethane, 4.0 g (40 mmol) of γ-valerolactone, 4.8 g (60 mmol) of pyridine, 300 g of NMP and 20 g of toluene. The mixture was heated at 180° C. for 3 hours, to obtain a polyimide resin solution. The polyimide resin had a number average molecular weight of 31,000 and a weight average molecular weight of 78,000. The procedures thereafter were carried out in the same manner as in Example 1 except that the above polyimide resin was used in place of the block copolymer polyimide resin used in Example 1, to obtain a copper-clad laminate having a thickness of 0.4 mm. Table 2 shows the evaluation results.

TABLE 1

Evaluation Results

| | | Ex. 1 | Ex. 2 | Ex. 3 | Ex. 4 |
|---|---|---|---|---|---|
| Resin composite copper foil | Resin | Block copolymer polyimide | | | |
| | Total thickness (μm) | 17 | 18 | 17 | 15 |
| Copper foil adhesive strength (kg/cm) | | 1.2 | 1.3 | 1.2 | 1.0 |
| Heat resistance in air | | ooo | ooo | ooo | ooo |
| Heat resistance after moisture absorption | 1 hour | ooo | ooo | ooo | ooo |
| | 3 hours | ooo | ooo | ooo | ooo |
| | 5 hours | ooo | ooo | ooo | ooo |

Ex. = Example

TABLE 2

Evaluation Results

| | | CEx. 1 | CEx. 2 | CEx. 3 |
|---|---|---|---|---|
| Resin composite copper foil | Resin | — | Epoxy | Polyimide |
| | Total thickness (μm) | — | 15 | 16 |
| Copper foil adhesive strength (kg/cm) | | 0.6 | 0.9 | 0.4 |
| Heat resistance in air | | ooo | xxx | ooo |
| Heat resistance | 1 hour | ooo | oox | xxx |

TABLE 2-continued

Evaluation Results

| | | CEx. 1 | CEx. 2 | CEx. 3 |
|---|---|---|---|---|
| after moisture absorption | 3 hours | ooo | xxx | xxx |
| | 5 hours | oox | xxx | xxx |

CEx. = Comparative Example (Measurement Methods)
1) Molecular Weight:
Measured by GPC (gel permeation chromatography), calculated as polystyrene. In the measurement, NMP was used as a solvent.
2) Total Thickness:
Measured for thickness at five points with a micrometer according to JIS C6481, to obtain an average value.
3) Copper Foil Adhesive Strength:
Measured three times according to JIS C6481, to obtain an average value.
4) Heat Resistance in Air:
Heat treatment was carried out in a hot-air dryer at 240° C. for 30 minutes according to JIS C6481. Then, the presence or absence of a defective condition of appearance change was checked by visual observation. (O: no defective condition, x: swelling or peeling off occurred)
5) Heat Resistance After Moisture Absorption:
The entire copper foil of a 50 mm×50 mm square sample other than a copper foil on the half of one surface of the sample was removed by etching. The sample was treated with a pressure cooker testing machine (PC-3 type, supplied by Hirayama Manufacturing Corporation) at 121° C. at 2 atmospheric pressure for a predetermined time, then the sample was allowed to float in a solder bath at 260° C. for 60 seconds, and the presence or absence of a defective condition of appearance change was checked by visual observation. (O: no defective condition, x: swelling or peeling off occurred).

Example 5

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 117.68 g (400 mmol) of 3,4,3',4'-biphenyltetracarboxylic dianhydride, 87.7 g (300 mmol) of 1,3-bis(3-aminophenoxy)benzene, 4.0 g (40 mmol) of γ-valerolactone, 4.8 g (60 mmol) of pyridine, 300 g of N-methyl-2-pyrrolidone (to be referred to as "NMP" hereinafter) and 20 g of toluene. The mixture was heated at 180° C. for 1 hour and then cooled down to about room temperature. 29.42 g (100 mmol) of 3,4,3',4'-biphenyltetracarboxylic dianhydride, 82.12 g (200 mmol) of 2,2-bis{4-(4-aminophenoxy)phenyl}propane, 200 g of NMP and 40 g of toluene were added and the components were mixed at room temperature for 1 hour and then heated at 180° C. for 3 hours, to obtain a block copolymer polyimide resin solution having a solid content of 38%. The block copolymer polyimide resin had a formula (1): formula (2) ratio of 3:2, a number average molecular weight of 70,000 and a weight average molecular weight of 150,000. The block copolymer polyimide resin solution was further diluted with NMP to prepare a block copolymer polyimide resin solution having a solid content of 15%. This block copolymer polyimide resin solution was applied to a mat surface of an electrolytic copper foil (F3-WS foil, Rz=2.4 μm, supplied by Furukawa circuit foil Co., Ltd.) having a thickness of 12 μm with a reverse roll coating machine. The applied solution was dried under a nitrogen atmosphere at 120° C. for 3 minutes and 160° C. for 3 minutes and then lastly heated at 260° C. for 3 minutes, whereby resin composite copper foils were prepared. On the other hand, 400 g of 2,2-bis(4-cyanatophenyl) propane was molten at 150° C. and allowed to react with stirring for 4 hours, the resultant reaction product was dissolved in methyl ethyl ketone and 600 g of a brominated bisphenol A type epoxy resin (EPICLON 1123P, supplied by Dainippon Ink and Chemicals, Incorporated) and 0.1 part of zinc octylate were added to prepare a varnish. The varnish was impregnated into a glass woven fabric base material having a thickness of 100 μm and then heated at 150° C. for 6 minutes, whereby B-stage resin composition layers (prepregs) having a resin amount of 45%, a thickness of 105 μm and a gelation time (at 170° C.) of 120 seconds were prepared. Four prepregs were stacked. The above resin composite copper foils were placed on the upper surface and lower surface of the stacked prepregs, one copper foil on each surface, such that the resin layer surfaces of the resin composite copper foils faced to the upper and lower surfaces, and the resultant set was laminate-molded at a temperature of 220° C. at a pressure of 40 kgf/cm$^2$ and under a vacuum degree of 30 mmHg or less for 1 hour, to obtain a copper-clad laminate having a thickness of 0.4 mm. Predetermined through holes were made in the copper-clad laminate with a drill and a laser. The copper foils as external layers were removed by etching. Without carrying out a roughening treatment of insulating layers, according to the semi-additive method, 1 μm thick electroless copper plating was carried out and then 1 μm thick electrolytic copper plating was carried out. Then, a plating resist having a pattern reverse to the position of a conductor layer of an intended printed wiring board was formed on the electrolytic copper plating on each surface of the laminate. Further, electrolytic plating was carried out to form 15 μm thick electrolytic plating. The plating resists were removed. 2 μm of the plated copper was removed by etching, to form patterns. Then, heat-treatment (anneal treatment) was carried out at 170° C. for 60 minutes, to obtain a printed wiring board. Table 3 shows the evaluation results.

Example 6

Patterns were formed in a copper-clad laminate which was the same as the copper-clad laminate obtained in Example and the surface of the copper-clad laminate was subjected to blackening treatment, to prepare an internal layer circuit substrate. Prepregs which were the same as the prepreg obtained in Example 5 were disposed on upper and lower surfaces of the internal layer circuit substrate, one prepreg on each surface, and resin composite copper foils which were the same as the resin composite copper foil obtained in Example 5 were disposed thereon, one copper foil on each surface, such that their resin layer surfaces faced to the prepregs respectively, and the resultant set was laminate-molded at a temperature of 220° C. at a pressure of 40 kgf/cm$^2$ and under a vacuum degree of 30 mmHg or less for 1 hour, to obtain an internal-layer-circuit-inserted copper-clad laminate. Holes were made in predetermined through hole and via hole portions of the internal-layer-circuit-inserted copper-clad laminate with a drill and a laser. The copper foils as external layers were removed by etching. Then, without carrying out a roughening treatment of insulating layers, 1 μm thick electroless copper plating was carried out. Then 15 μm thick electrolytic copper plating was carried out. Patterns were formed according to the subtractive method. Heat-treatment (anneal) treatment was carried out at 170° C. for 60 minutes, to obtain a multilayer printed wiring board. Table 3 shows the evaluation results.

Example 7

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 117.68 g (400 mmol) of 3,4,3',4'-biphenyltetracarboxylic dianhydride, 123.18 g (300 mmol) of 2,2-bis{4-(4-aminophenoxy)phenyl}propane, 4.0 g (40 mmol) of γ-valerolactone, 4.8 g (60 mmol) of pyridine, 300 g of NMP and 20 g of toluene. The mixture was heated at 180° C. for 1 hour and then cooled down to about room temperature. 29.42 g (100 mmol) of 3,4,3',4'-biphenyltetracarboxylic dianhydride, 58.47 g (200 mmol) of 1,3-bis(3-aminophenoxy)benzene, 200 g of NMP and 40 g of toluene were added and the components were mixed at room temperature for 1 hour and then heated at 180° C. for 3 hours, to obtain a block copolymer polyimide resin solution having a solid content of 38%. The block copolymer polyimide resin had a formula (1): formula (2) ratio of 2:3, a number average molecular weight of 75,000 and a weight average molecular weight of 160,000. The block copolymer polyimide resin solution was further diluted with NMP to prepare a block copolymer polyimide resin solution having a solid content of 15%. Then, resin composite copper foils were prepared in the same manner as in Example 1 except that this block copolymer polyimide resin solution was used. The resin composite copper foils were used to prepare a copper-clad laminate having a thickness of 0.4 mm. The copper foils as external layers were removed by etching. Then, without carrying out a roughening treatment of insulating layers, patterns were formed according to the semi-additive method similarly to Example 5. Heat treatment (anneal treatment) was carried out at 170° C. for 60 minutes, to obtain a printed wiring board. Table 3 shows the evaluation results.

Comparative Example 4

Four prepregs which were the same as the prepreg obtained in Example 5 were stacked. 12 μm thick electrolytic copper foils (3EC-III foils: Rz=4.5 μm, supplied by MITSUI MINING & SMELTING CO., LTD) were disposed on the upper surface and lower surface of the stacked prepregs, one copper foil on each surface, and the resultant set was laminate-molded for 1 hour at 220° C. at a pressure of 40 kgf/cm$^2$ and at a vacuum degree of 30 mmHg or less, to prepare a copper-clad laminate. Predetermined through holes were made in the copper-clad laminate with a drill and a laser and the copper foils as external layer were removed by etching. Patterns were formed according to the semi-additive method without carrying out a roughening treatment of insulating layers similarly to Example 5. Heat treatment (anneal treatment) was carried out at 170° C. for 60 minutes, to obtain a printed wiring board. Table 4 shows the evaluation results.

Comparative Example 5

1,000 g of methyl ethyl ketone was added to 400 g of a bisphenol A type epoxy resin (Epikote 1001, supplied by Japan Epoxy Resins Co., Ltd.), 300 g of a bisphenol A type epoxy resin (Epikote 828, supplied by Japan Epoxy Resins Co., Ltd.), 300 g of low-molecular-weight liquid rubber (CTBN1300x31, supplied by UBE INDUSTRIES, LTD) and 10 g of 2-ethyl-4-methylimidazole (supplied by Shikoku Corporation) and the components were stirred and dissolved at room temperature for 1 hour to obtain a varnish. The varnish was applied to a mat surface of an electrolytic copper foil (F3-WS foil) having a thickness of 12 μm with a reverse roll coating machine and dried under heat in a heating furnace at 150° C. for 10 minutes, whereby epoxy resin type resin composite copper foils were prepared. The procedures thereafter were carried out in the same manner as in Example 5 except that the above epoxy resin type resin composite copper foils were used in place of the resin composite copper foils of the block copolymer polyimide resin used in Example 5, to obtain a copper-clad laminate having a thickness of 0.4 mm. Predetermined through holes were made in the copper-clad laminate with a drill and a laser, the copper foils as external layers were removed by etching, then the surfaces of insulating layers were roughening-treated with an alkali oxidizer of permanganate, patterns were formed according to the subtractive method similarly to Example 6 and heat treatment (anneal treatment) was carried out at 170° C. for 60 minutes, to obtain a printed wiring board. Table 4 shows the evaluation results.

Comparative Example 6

A 2-liter three-necked flask having an anchor type stirring rod made of stainless steel, a trap equipped with a nitrogen-introducing tube and a stopcock, and a reflux condenser having a cooling tube with a ball, installed on the trap, was charged with 164 g (400 mmol) of ethylene glycol bistrimellitate dianhydride, 124 g (400 mmol) of 4,4'-diamino-3,3',5,5'-tetraethyldiphenylmethane, 4.0 g (40 mmol) of γ-valerolactone, 4.8 g (60 mmol) of pyridine, 300 g of NMP and 20 g of toluene. The mixture was heated at 180° C. for 3 hours, to obtain a polyimide resin solution. The polyimide resin had a number average molecular weight of 31,000 and a weight average molecular weight of 78,000. The procedures thereafter were carried out in the same manner as in Example except that the above polyimide resin was used in place of the block copolymer polyimide resin used in Example 5, to obtain a copper-clad laminate having a thickness of 0.4 mm. The copper foils as external layers were removed by etching. Without carrying out a roughening treatment of insulating layers, patterns were formed according to the semi-additive method. Heat treatment (anneal treatment) was carried out at 170° C. for 60 minutes, to obtain a printed wiring board. Table 4 shows the evaluation results.

Comparative Example 7

External layer copper foils of a copper-clad laminate which was the same as the copper-clad laminate obtained in Comparative Example 6 were removed by etching. Then, the surfaces of insulating layers were roughening-treated with an alkali oxidizer of permanganate, patterns were formed according to the semi-additive method and heat treatment (anneal treatment) was carried out at 170° C. for 60 minutes, to obtain a printed wiring board. Table 4 shows the evaluation results.

TABLE 3

| | Evaluation Results | | |
|---|---|---|---|
| | | Example 5 | Example 6 | Example 7 |
| External layer insulating layer | Resin Thickness (μm) | Block copolymer polyimide | | |
| | | 3 | 5 | 7 |

TABLE 3-continued

| | Evaluation Results | | |
|---|---|---|---|
| | Example 5 | Example 6 | Example 7 |
| Adhesive strength of conductor layer (kg/cm) | 1.2 | 1.2 | 1.1 |
| Surface roughness of insulating layer (μm) | 2.4 | 2.3 | 2.4 |
| Heat resistance in air | ooo | ooo | ooo |

TABLE 4

| | Evaluation Results (2) | | | |
|---|---|---|---|---|---|
| | | CEx. 4 | CEx. 5 | CEx. 6 | CEx. 7 |
| External layer insulating layer | Resin Thickness (μm) | Cyanate — | Epoxy 5 | Polyimide 6 | Polyimide 6 |
| Adhesive strength of conductor layer (kg/cm) | | 0.2 | 0.8 | 0.1 | 0.7 |
| Surface roughness of insulating layer (μm) | | 4.5 | 6.7 | 2.4 | 5.3 |
| Heat resistance in air | | ooo | xxx | ooo | ooo |

CEx. = Comparative Example (Measurement Methods)

1) External Layer Insulating Layer Thickness:

The thickness of resin composite copper foil was measured at five points with a micrometer according to JIS C6481, to obtain an average value of the values measured at these five points. The officially-announced thickness of copper foil was deducted from the above average value, to determine an external layer insulating layer thickness.

2) Adhesive Strength of Conductor Layer:

Measured three times according to JIS C6481, to obtain an average value.

3) Surface Roughness of Insulating Layer:

Measured for Rz (ten-points average roughness) three times according to JIS B0601, to obtain an average value.

Example 8

A copper-clad laminate was obtained in the same manner as in Example 7 except that a resin composite copper foil having an external layer insulating layer thickness different from that of the resin composite copper foil used in Example 7 was prepared. The procedures thereafter were carried out in the same manner as in Example 7 except that after the formation of 1 μm-thick electroless copper plating according to the semi-additive process, heating was carried out in a nitrogen-atmosphere oven at 150° C. for 60 minutes, to obtain a printed wiring board. Table 5 shows the evaluation results.

Comparative Example 8

A printed wiring board was obtained in the same manner as in Example 8 except that the heating treatment after the electroless copper plating and the heat treatment (anneal treatment) after the formation of patterns were not carried out. Table 5 shows the evaluation results.

TABLE 5

| | Example 8 | Comparative Example 8 |
|---|---|---|
| External layer insulating layer Resin | Block copolymer polyimide | |
| Thickness (μm) | 0.6 | 0.8 |
| Adhesive strength of conductor layer (kg/cm) | 1.2 | 0.7 |
| Surface roughness of insulating layer (μm) | 2.4 | 2.4 |
| Heat resistance in air | ooo | xxx |

1) External Layer Insulating Layer Thickness:

Resin composite copper foil and a copper foil used in the resin composite copper foil were respectively measured for their thickness at 51 points at intervals of 10 mm with a contact type film thickness measuring apparatus (MFC101) supplied by Sendai Nikon Corporation, thereby obtaining average values, respectively. The above average value of thickness of the copper foil was deducted from the average value of thickness of the resin composite copper foil, to determine an external layer insulating layer thickness.

What is claimed is:

1. A resin composite metal foil comprising a metal foil and a layer of a block copolymer polyimide resin formed on one surface of the metal foil,
   wherein the block copolymer polyimide resin consists essentially of a structural unit represented by the formula (1) and a structural unit represented the formula (2),

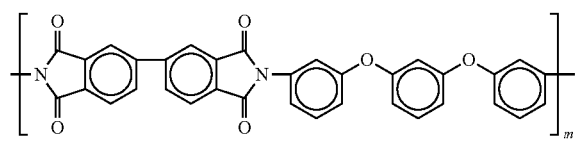

(1)

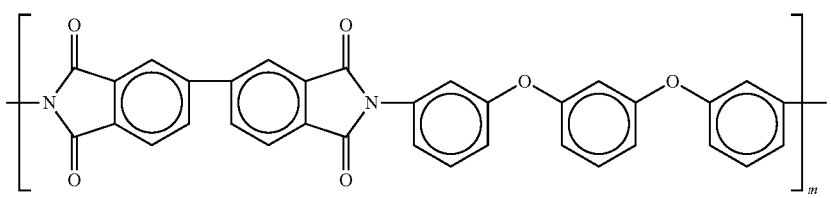

(2)

wherein m and n are integers which satisfy m:n=1:9 to 3:1.

2. A resin composite metal foil according to claim 1,
   wherein the layer of the block copolymer polyimide resin has a thickness of from 0.1 μm to 10 μm.

3. A resin composite metal foil according to claim 1,
   wherein the metal foil has a surface roughness (Rz) of 4 μm or less.

4. A metal-foil-clad laminate obtained by laminate-molding the resin composite metal foil recited in claim 1 and a B-stage resin composition layer.

5. A printed wiring board using the metal-foil-clad laminate recited in claim 4.

6. A process for the production of a printed wiring board comprising removing an external layer metal foil of a metal-foil-clad laminate and forming a conductor layer on an external layer insulating layer by plating,
   wherein the metal-foil-clad laminate comprises a layer of a block copolymer polyimide resin which layer is in contact with the external layer metal foil wherein the block copolymer polyimide resin consists essentially of a structural unit represented by the formula (1) and a structural unit represented the formula (2),

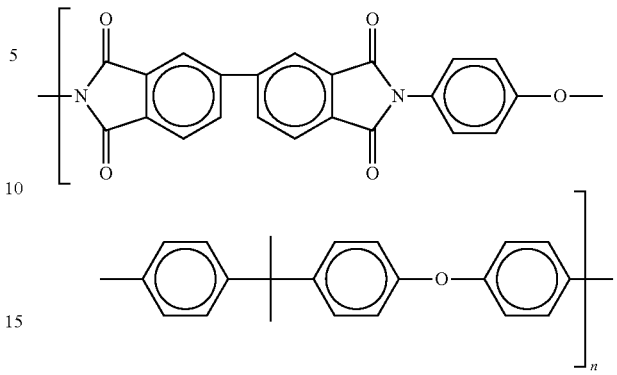

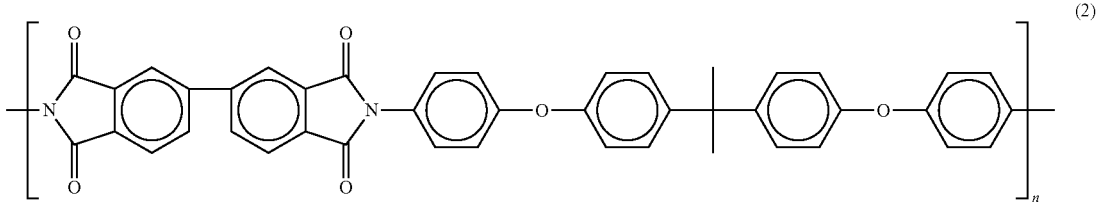

wherein m and n are integers which satisfy m:n=1:9 to 3:1.

7. A process according to claim 6,
wherein the thickness of the layer of the block copolymer polyimide resin is from 0.1 to 10 μm.

8. A process according to claim 6
wherein a surface of the external layer metal foil which surface is in contact with the layer of the block copolymer polyimide resin has a surface roughness (Rz) of 4 um or less.

9. A process according to claim 6,
wherein the conductor layer is formed by plating without carrying out a roughening treatment of the external layer insulating layer after removing the external layer metal foil of the metal-foil-clad laminate.

10. A process according to claim 6,
wherein, in the formation of the conductor layer on the external layer insulating layer by plating, electroless plating is carried out and then heating is carried out at 100 to 170° C. for 1 to 5 hours.

11. A process according to claim 6,
wherein, in the formation of the conductor layer on the external layer insulating layer by plating, electroless copper plating is carried out, then electrolytic copper plating is carried out and then the conductor layer is formed according to a semi-additive process.

12. A process according to claim 6,
wherein, in the formation of the conductor layer on the external layer insulating layer by plating, electroless copper plating is carried out, then electrolytic copper plating is carried out and then the conductor layer is formed according to a subtractive process.

13. A process according to claim 6,
wherein the metal-foil-clad laminate is an internal-layer-circuit-inserted metal-foil-clad laminate.

* * * * *